(12) United States Patent  
Huang

(10) Patent No.: US 6,492,276 B1
(45) Date of Patent: Dec. 10, 2002

(54) HARD MASKING METHOD FOR FORMING RESIDUE FREE OXYGEN CONTAINING PLASMA ETCHED LAYER

(75) Inventor: Ming-Hsin Huang, Hsin-chu (TW)

(73) Assignee: Taiwan Semiconductor Manufacturing Company, Hsin-Chu (TW)

( * ) Notice: Subject to any disclaimer, the term of this patent is extended or adjusted under 35 U.S.C. 154(b) by 0 days.

(21) Appl. No.: 09/086,774

(22) Filed: May 29, 1998

(51) Int. Cl.$^7$ ............................................ H01L 21/311
(52) U.S. Cl. ..................... 438/700; 438/637; 438/706; 438/725; 216/81
(58) Field of Search ............................ 438/780, 725, 438/622, 623, 624, 637, 706, 707, 712, 733, 700; 216/80, 81, 79, 67, 64, 63

(56) References Cited

U.S. PATENT DOCUMENTS

| | | | |
|---|---|---|---|
| 5,246,883 A | 9/1993 | Lin et al. | 437/195 |
| 5,460,693 A | 10/1995 | Moslehi | 156/662.1 |
| 5,468,561 A | * 11/1995 | Cho | 428/721 |
| 5,514,247 A | 5/1996 | Shan et al. | 156/643.1 |
| 5,529,953 A | 6/1996 | Shoda | 437/189 |
| 5,565,384 A | 10/1996 | Havemann | 437/228 |
| 5,654,240 A | 8/1997 | Lee et al. | 438/647 |
| 5,677,243 A | 10/1997 | Ohsaki | 437/195 |
| 6,114,236 A | * 9/2000 | Sugai | 438/637 |
| 6,204,168 B1 | * 3/2001 | Naik et al. | 438/638 |
| 6,245,489 B1 | * 6/2001 | Baklanov et al. | 430/313 |

OTHER PUBLICATIONS

CY Chang et al, ULSI Technology, The McGraw–Hill Companies Inc, 1996, p446–447.
Korczynski, "Low–K dielectric integration cost modeling" Solid State Technology, Oct. 1997. p123–28.

* cited by examiner

Primary Examiner—Tuan H. Nguyen
Assistant Examiner—Thanhha Pham
(74) Attorney, Agent, or Firm—George O. Saile; Stephen B. Ackerman; Stephen G. Stanton

(57) ABSTRACT

A method for forming a patterned layer within a microelectronics fabrication. There is first provided a substrate employed within a microelectronics fabrication. There is then formed over the substrate an oxygen containing plasma etchable layer, where the oxygen containing plasma etchable layer is formed of a carbon and fluorine containing material. There is then formed over the oxygen containing plasma etchable layer a mask layer. There is then etched through use an oxygen containing plasma etch method while employing the mask layer as an etch mask layer the oxygen containing plasma etchable layer to form a patterned oxygen containing plasma etched layer, where the oxygen containing plasma etch method employs an etchant gas composition comprising an oxygen containing etchant gas and a fluorine containing etchant gas.

26 Claims, 3 Drawing Sheets

HARD MASKING METHOD FOR FORMING RESIDUE FREE OXYGEN CONTAINING PLASMA ETCHED LAYER

BACKGROUND OF THE INVENTION

1. Field of the Invention

The present invention relates generally to oxygen containing plasma etchable layers within microelectronics fabrications. More particularly, the present invention relates to methods for forming residue free patterned oxygen containing plasma etched layers within microelectronics fabrications.

2. Description of the Related Art

Microelectronics fabrications are formed from microelectronics substrates over which are formed patterned microelectronics conductor layers which are separated by microelectronics dielectric layers.

As microelectronics integration levels have increased and microelectronics device and conductor element dimensions have decreased, it has become increasingly common within the art of microelectronics fabrication to employ interposed between the patterns of narrow linewidth dimension and/or narrow pitch dimension patterned microelectronics conductor layers within microelectronics fabrications microelectronics dielectric layers formed of low dielectric constant dielectric materials. For the purposes of this disclosure, low dielectric constant dielectric materials are intended as dielectric materials having a dielectric constant of less than about 3.0. For comparison purposes, dielectric layers formed of conventional silicon oxide dielectric materials, silicon nitride dielectric materials or silicon oxynitride dielectric materials typically have dielectric constants in the range of from about 4.0 to about 5.0.

Microelectronics dielectric layers formed of low dielectric constant dielectric materials are desirable interposed between the patterns of narrow linewidth dimension and/or narrow pitch dimension patterned microelectronics conductor layers within microelectronics fabrications since such dielectric layers formed from such low dielectric constant dielectric materials provide dielectric layers through which there may be fabricated microelectronics fabrications with enhanced microelectronics fabrication speed, attenuated patterned microelectronics conductor layer parasitic capacitance and attenuated patterned microelectronics conductor layer cross-talk.

Low dielectric constant dielectric materials which may be employed for forming low dielectric constant microelectronics dielectric layers within microelectronics fabrications are typically materials with hydrogen and/or carbon content, such as but not limited to organic polymer spin-on-polymer dielectric materials (such as but not limited to polyimide organic polymer spin-on-polymer dielectric materials, poly (arylene ether) organic polymer spin-on-polymer dielectric materials and fluorinated poly (arylene ether) organic polymer spin-on-polymer dielectric materials), amorphous carbon dielectric materials (such as but not limited to amorphous carbon and fluorinated amorphous carbon), and silsesqiuoxane spin-on-glass (SOG) dielectric materials (such as but not limited to hydrogen silsesquioxane spin-on-glass (SOG) dielectric materials, carbon bonded hydrocarbon silsesquioxane spin-on-glass (SOG) dielectric materials and carbon bonded fluorocarbon silsesquioxane spin-on-glass (SOG) dielectric materials).

While organic polymer spin-on-polymer dielectric materials, amorphous carbon dielectric materials, and silsesquioxane spin-on-glass (SOG) dielectric materials are thus desirable within the art of microelectronics fabrication for forming low dielectric constant microelectronics dielectric layers within microelectronics fabrications, organic polymer spin-on-polymer dielectric materials, amorphous carbon dielectric materials, and silsesquioxane spin-on-glass (SOG) dielectric materials are not entirely without problems in forming low dielectric constant microelectronics dielectric layers within microelectronics fabrications. In particular, it has been observed that when forming vias through carbon and fluorine containing oxygen containing plasma etchable fluorinated poly (arylene ether) organic polymer spin-on polymer dielectric materials to reach contact layers or contact regions formed within microelectronics fabrications while employing oxygen containing plasma etch methods as are disclosed within related co-pending and co-assigned patent application Ser. No. 09/086,772 filed May 27, 1998, issued as U.S. Pat. No. 6,019,906 on Feb. 1, 2000 titled Hard Masking Method for Forming Patterned Oxygen Containing Plasma Etchable Layer, there is often formed upon the sidewalls of the vias residue layers, which are presumably fluoropolymer residue layers. Such residue layers are undesirable when formed upon the sidewalls of vias formed through carbon and fluorine containing dielectric layers such as but not limited to fluorinated poly (arylene ether) organic polymer spin-on-polymer dielectric layers since their presence often precludes forming within those vias fully functional or reliable conductor stud layers.

It is thus towards the goal of forming within advanced microelectronics fabrications while employing oxygen containing plasma etch methods patterned low dielectric constant microelectronics dielectric layers formed from oxygen containing plasma etchable dielectric materials formed of carbon and fluorine containing materials, with attenuated residue formation upon the sidewalls of those patterned low dielectric constant microelectronics dielectric layers, that the present invention is more specifically directed. In a more general sense, the present invention is also directed towards forming within advanced microelectronics fabrications while employing oxygen containing plasma etch methods patterned microelectronics layers (not necessarily patterned microelectronics dielectric layers) formed of oxygen containing plasma etchable materials formed of carbon and fluorine containing materials, with attenuated residue formation upon the sidewalls of those patterned microelectronics layers.

Consistent with that which is cited within related co-pending and co-assigned Ser. No. 09/086,772 filed May 27, 1998, issued as U.S. Pat. No. 6,019,906 on Feb. 1, 2000 various photolithographic and etch methods have been disclosed in the art of microelectronics fabrication for forming patterned microelectronics layers within microelectronics fabrications.

For example, Liu in ULSI Technology, C. Y. Chang et al., eds., McGraw-Hill (1996), pp. 446–47, discloses in general various methods for forming within integrated circuit microelectronics fabrications bordered and borderless stacked patterned conductor contact layers. Disclosed are both damascene and non-damascene methods for forming the bordered and borderless stacked patterned conductor contact layers.

Similarly, Korczynski, in "Low-k dielectric integration cost modelling," Solid State Technology, October 1997, pp. 123–28, discloses in general various methods for forming patterned low dielectric constant dielectric layers interposed between the patterns of patterned conductor interconnection layers within microelectronics fabrications. Disclosed are standard patterned conductor metal interconnection formation and isolation methods and dual damascene patterned conductor metal interconnection formation and isolation methods.

In addition, Lin et al., in U.S. Pat. No. 5,246,883, discloses a method for forming a contact via structure through at least one dielectric layer within an integrated circuit microelectronics fabrication. The method employs at least the one dielectric layer having formed thereover a first buffer layer which in turn has formed thereupon a second buffer layer, where the second buffer layer has a higher isotropic etch rate in an isotropic etch method than the first buffer layer. By employing the isotropic etch method for etching the second buffer layer and at least a portion of the first buffer layer, followed by an anisotropic etch method for etching any remainder of the first buffer layer and at least the one dielectric layer, the taper of the sidewall of a via formed through at least the second buffer layer, the first buffer layer and the dielectric layer may be controlled.

Further, Moslehi, in U.S. Pat. No. 5,460,693, discloses a photolithography method for use in fabricating patterned integrated circuit microelectronics layers within integrated circuit microelectronics fabrications, where the photolithography method is undertaken employing dry processing methods only. The completely dry processing photolithography method employs a halogen doped silicon layer or a halogen doped silicon-germanium layer as a photosensitive layer from which is subsequently grown an oxide hard mask layer employed as an etch mask layer when etching a processable integrated circuit microelectronics layer formed below the halogen doped silicon layer or the halogen doped silicon-germanium layer.

Yet further, Havemann, in U.S. Pat. No. 5,565,384, discloses a method for forming within an integrated circuit microelectronics fabrication a self-aligned via through an inorganic dielectric layer to access a patterned conductor layer formed below the inorganic dielectric layer, where the patterned conductor layer has interposed at least partially between its patterns an organic containing dielectric layer. The patterned conductor layer and the organic dielectric layer are completely covered by the inorganic dielectric layer. The method employs an anisotropic etchant which is selective to the inorganic dielectric layer with respect to the organic dielectric layer, such that the organic dielectric layer serves as an etch stop layer when etching the self-aligned via through the inorganic dielectric layer, thus avoiding overetching of the organic dielectric layer.

Still yet further, Shoda, in U.S. Pat. No. 5,529,953, discloses a method for forming within an integrated circuit microelectronics fabrication a void free patterned contiguous interconnection and contact stud layer within a dielectric layer having formed therein an interconnection trench contiguous with but at a different level than a contact via. The method employs forming upon the floor of the interconnection trench a first material which exhibits a first incubation time for forming the patterned contiguous interconnection and contact stud layer thereupon. The method also employs forming upon the floor of the contact via a second material which exhibits a second incubation time for forming the patterned contiguous interconnection and contact stud layer thereupon, where the first incubation time is greater than the second incubation time.

Moreover, Ohsaki, in U.S. Pat. No. 5,677,243, discloses a method for forming an interconnection stud layer within an interconnection via within a dielectric layer within an integrated circuit, where the interconnection via is conventionally formed employing a single etch method while employing a pair of patterned photoresist etch mask layers sequentially overlying the dielectric layer. The method employs a sacrificial organic interconnection via filling layer filled within the interconnection via subsequent to a first etch method within a pair of etch methods, such that the pair of etch methods may be undertaken with separate patterned photoresist layers and thus provide the interconnection stud layer and interconnection via of maximum width.

Finally, Lee et al., in U.S. Pat. No. 5,654,240, discloses a method for forming a patterned conductor contact layer contacting a semiconductor substrate within an integrated circuit microelectronics fabrication, while avoiding trenching within the semiconductor substrate when etching the patterned conductor contact layer from a corresponding blanket conductor contact layer formed contacting the semiconductor substrate. The method employs: (1) a first patterned conductor layer formed upon a patterned dielectric layer formed upon the semiconductor substrate, where the first patterned conductor layer does not contact the semiconductor substrate; and (2) a second patterned conductor layer patterned to terminate upon the first patterned conductor layer while contacting the first patterned conductor layer and the semiconductor substrate.

In addition to that which is cited within related co-pending and co-assigned patent application, Shan et al., in U.S. Pat. No. 5,514,247, discloses a plasma etch method for forming a via through a dielectric layer within a semiconductor integrated circuit microelectronics fabrication, where there is attenuated formation of a metalpolymer residue layer upon a sidewall of the via. The plasma etch method employs within the dielectric layer plasma etchant gas composition an etchant gas which volatilizes a metal which would otherwise form the metal-polymer layer.

Desirable in the art of microelectronics fabrication are oxygen containing plasma etch methods for forming patterned low dielectric constant microelectronics dielectric layers formed from oxygen containing plasma etchable dielectric materials which are formed of carbon and fluorine containing materials, with attenuated residue formation upon the sidewalls of those patterned low dielectric constant microelectronics dielectric layers. More particularly desirable within the art of microelectronics fabrication are plasma etch methods for forming patterned microelectronics layers (not necessarily patterned microelectronics dielectric layers) formed of oxygen containing plasma etchable materials which are formed of carbon and fluorine containing materials, with attenuated residue formation upon the sidewalls of those patterned microelectronics layers.

It is towards the foregoing objects that the present invention is both generally and more specifically directed.

SUMMARY OF THE INVENTION

A first object of the present invention is to provide an oxygen containing plasma etch method for forming within a microelectronics fabrication a patterned microelectronics layer formed from an oxygen containing plasma etchable material formed from a carbon and fluorine containing material.

A second object of the present invention is to provide a method in accord with the first object of the present invention, where the patterned microelectronics layer is formed with attenuated residue formation upon a sidewall of the patterned microelectronics layer.

A third object of the present invention is to provide a method in accord with the first object of the present invention or the second object of the present invention, where the oxygen containing plasma etchable material is a low dielectric constant dielectric material.

A fourth object of the present invention is to provide a method in accord with the first object of the present invention, the second object of the present invention, or the third object of the present invention, which method is readily commercially implemented.

In accord with the objects of the present invention, there is provided by the present a method for forming a patterned layer within a microelectronics fabrication. There is first provided a substrate employed within a microelectronics fabrication. There is then formed over the substrate an oxygen containing plasma etchable layer, where the oxygen containing plasma etchable layer is formed of a carbon and fluorine containing material. There is then formed over the oxygen containing plasma etchable layer a mask layer. There is then etched through use of an oxygen containing plasma etch method the oxygen containing plasma etchable layer to form a patterned oxygen containing plasma etched layer. The oxygen containing plasma etch method employs an etchant gas composition comprising an oxygen containing etchant gas and a fluorine containing etchant gas.

There is provided by the present invention an oxygen containing plasma etch method for forming within a microelectronics fabrication a patterned microelectronics layer formed from an oxygen containing plasma etchable material which is formed from a carbon and fluorine containing material, where the patterned microelectronics layer is formed with attenuated residue formation upon a sidewall of the patterned microelectronics layer. The method of the present invention realizes the foregoing object by employing when forming the patterned microelectronics layer an etchant gas composition employing in addition to an oxygen containing etchant gas a fluorine containing etchant gas. While the mechanism through which incorporation of a fluorine containing etchant gas in conjunction with an oxygen containing etchant gas when forming a patterned oxygen containing plasma etched microelectronics layer formed from a carbon and fluorine containing material provides the patterned oxygen containing plasma etched microelectronics layer with attenuated residue formation upon its sidewall is not entirely clear, it is nonetheless clear that there may be attenuated the formation of the residue layer upon the sidewall of the patterned oxygen containing plasma etched layer when employing when forming the oxygen containing plasma etched layer the fluorine containing etchant gas in addition to the oxygen containing etchant gas.

The method of the present invention may be employed where the oxygen containing plasma etchable layer formed from the carbon and fluorine containing material is a low dielectric constant dielectric layer. The method of the present invention does not discriminate with respect to the nature of the oxygen containing plasma etchable material from which is formed a patterned oxygen containing plasma etched layer in accord with the method of the present invention. Thus, although the method of the present invention is most likely to provide value when the oxygen containing plasma etchable layer formed of the carbon and fluorine containing material is a low dielectric constant dielectric layer, the method of the present invention may also be employed when the oxygen containing plasma etchable layer is formed of a carbon and fluorine containing material other than a low dielectric constant dielectric material.

The method of the present invention is readily commercially implemented. The present invention employs methods and materials as are otherwise generally known in the art of microelectronics fabrication. Since it is the process ordering and process control within the present invention which provides the method of the present invention, rather than the existence of individual methods and materials employed within the method of the present invention which provides the method of the present invention, the method of the present invention is readily commercially implemented.

BRIEF DESCRIPTION OF THE DRAWINGS

The objects, features and advantages of the present invention are understood within the context of the Description of the Preferred Embodiments, as set forth below. The Description of the Preferred Embodiments is understood within the context of the accompanying drawings, which form a material part of this disclosure, wherein.

DESCRIPTION OF THE PREFERRED EMBODIMENTS

There is provided by the present invention an oxygen containing plasma etch method for forming within a microelectronics fabrication a patterned microelectronics layer formed from an oxygen containing plasma etchable material formed from a carbon and fluorine containing material, where the patterned microelectronics layer is formed with attenuated residue formation upon a sidewall of the patterned microelectronics layer. The method of the present invention realizes the foregoing object by employing when forming the patterned microelectronics layer an oxygen containing etchant gas composition employing in addition to an oxygen containing etchant gas a fluorine containing etchant gas. While the mechanism through which incorporation of a fluorine containing etchant gas in conjunction with an oxygen containing etchant gas when forming a patterned oxygen containing plasma etchable layer formed of a carbon and fluorine containing material provides the patterned oxygen containing plasma etchable layer with attenuated residue formation upon its sidewall is not entirely clear, it is nonetheless clear that there may be attenuated the formation of a residue layer upon a sidewall of a patterned oxygen containing plasma etchable layer when employing when forming the oxygen containing plasma etchable layer a fluorine containing etchant gas in addition to an oxygen containing etchant gas.

Although the method of the present invention is most likely to provide value when forming within a microelectronics fabrication a via through a low dielectric constant microelectronics dielectric layer formed of an oxygen containing plasma etchable low dielectric constant dielectric material formed of a carbon and fluorine containing material, the method of the present invention may also be employed in forming patterned microelectronics layers formed of oxygen containing plasma etchable microelectronics materials including but not limited to oxygen containing plasma etchable microelectronics conductor materials, oxygen containing plasma etchable microelectronics semiconductor materials and oxygen containing plasma etchable microelectronics dielectric materials. Microelectronics fabrications within which may be formed patterned microelectronics layer of oxygen containing plasma etchable materials through the method of the present invention include but are not limited to integrated circuit microelectronics fabrications, solar cell microelectronics fabrications, ceramic substrate microelectronics fabrications and flat panel display microelectronics fabrications.

First Preferred Embodiment

Figure 1:
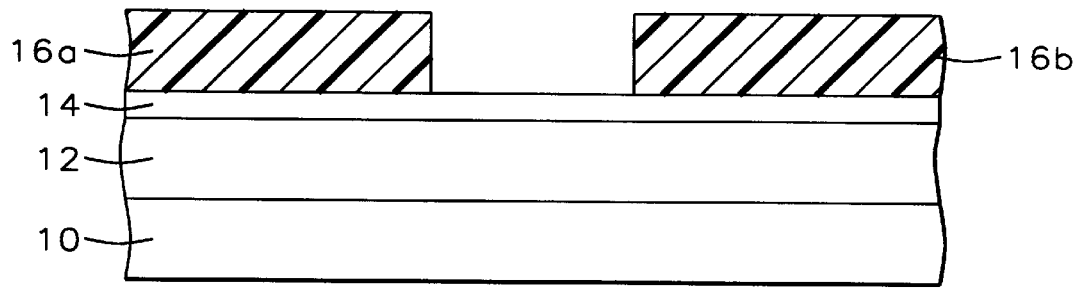
FIG. 1 to FIG. 3 show a series of schematic cross-sectional diagrams illustrating the results of forming within a microelectronics fabrication in accord with a general embodiment of the present invention which comprises a first preferred embodiment of the present invention a patterned oxygen containing plasma etched microelectronics layer from a blanket oxygen containing plasma etchable microelectronics layer.
Figure 2:
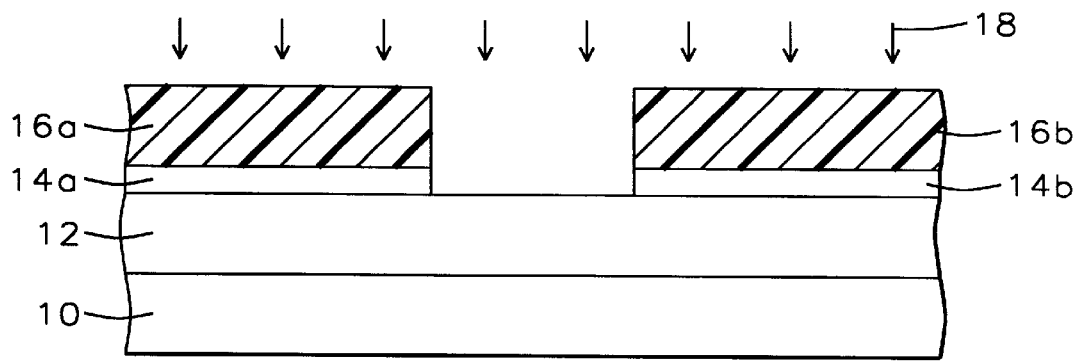
Figure 3:
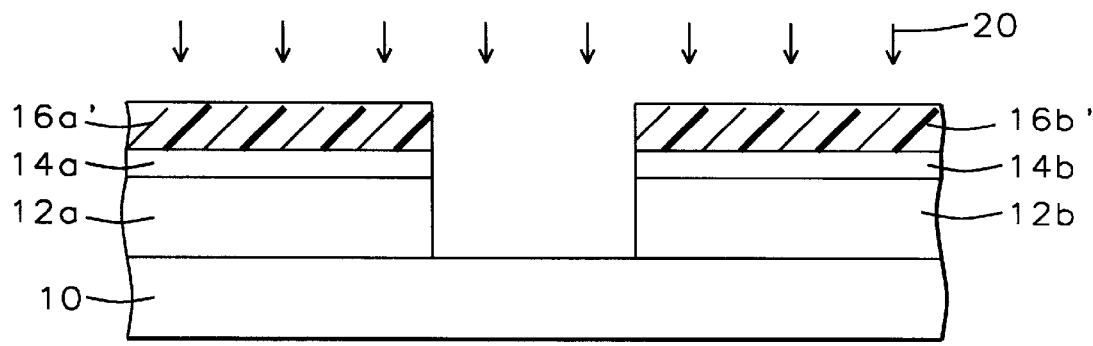

Referring now to FIG. 1 to FIG. 3, there is shown a series of schematic cross-sectional diagrams illustrating the results of forming within a microelectronics fabrication in accord with a general embodiment of the present invention which comprises a first preferred embodiment of the present invention a patterned microelectronics layer formed of an oxygen containing plasma-etchable material formed of a carbon and fluorine containing material. Shown in FIG. 1 is a schematic cross-sectional diagram of the microelectronics fabrication at an early stage in its fabrication in accord with the method of the present invention.

Shown in FIG. 1 is a substrate 10 employed within a microelectronics fabrication, where the substrate 10 has formed thereover a blanket oxygen containing plasma etchable layer 12. In turn, the blanket oxygen containing plasma etchable layer 12 has formed thereupon a blanket hard mask layer 14. Finally, the blanket hard mask layer 14 has formed thereupon a pair of patterned photoresist layers 16a and 16b.

Within the first preferred embodiment of the present invention, the substrate 10 may be employed within a microelectronics fabrication selected from the group of microelectronics fabrications including but not limited to semiconductor integrated circuit microelectronics fabrications, solar cell microelectronics fabrications, ceramic substrate microelectronics fabrications and flat panel display microelectronics fabrications. Similarly, although not specifically illustrated within the schematic cross-sectional diagram of FIG. 1, the substrate 10 may be the substrate alone employed within the microelectronics fabrication, or in the alternative, the substrate 10 may also be the substrate employed within the microelectronics fabrication, where the substrate 10 is intended to include the substrate alone employed within the microelectronics fabrication, along with additional microelectronics layers formed interposed between the substrate and the blanket oxygen containing plasma etchable layer 12. Such additional microelectronics layers may include, but are not limited to, microelectronics conductor layers, microelectronics semiconductor layers and microelectronics dielectric layers as are conventionally employed within a microelectronics fabrication within which is employed the substrate 10.

Similarly, although also not specifically illustrated within the schematic cross-sectional diagram of FIG. 1, the substrate 10, particularly when the substrate 10 is a semiconductor substrate employed within a semiconductor integrated circuit microelectronics fabrication, may also have formed therein or thereupon integrated circuit devices as are conventional to the microelectronics fabrication within which is employed the substrate 10. Such microelectronics devices may include, but are not limited to, resistors, transistors, capacitors and diodes.

Within the first preferred embodiment of the present invention with respect to the blanket oxygen containing plasma etchable layer 12, the blanket oxygen containing plasma etchable layer 12 is formed of an oxygen containing plasma etchable material formed of a carbon and fluorine containing material. Such oxygen containing plasma etchable materials may include, but are not limited to, oxygen containing plasma etchable conductor materials, oxygen containing plasma etchable semiconductor (or semidielectric) materials and oxygen containing plasma etchable dielectric materials. Specific examples of oxygen containing plasma etchable materials which may be employed for forming the blanket oxygen containing plasma etchable layer 12 include, but are not limited to, fluorinated organic polymer spin-on-polymer materials (such as but not limited to fluorinated poly (arylene ether) organic polymer spin-on-polymer materials, fluorinated polyimide organic polymer spin-on-polymer materials, and fluorinated acetylene organic polymer materials) and fluorinated amorphous carbon materials. Preferably, the blanket oxygen containing plasma etchable layer 12 is formed to a thickness of from about 5000 to about 10000 angstroms over the substrate 10.

Within the first preferred embodiment of the present invention with respect to the blanket hard mask layer 14, the blanket hard mask layer 14 is optional within the method of the present invention. Nonetheless, when present, the blanket hard mask layer 14 may be formed of any hard mask material which is not susceptible to etching within an oxygen containing plasma etch method which is subsequently employed when forming a series of patterned oxygen containing plasma etched layers from the blanket oxygen containing plasma etchable layer 12. Such hard mask materials may include, but are not limited to metals, metal alloys, metal oxides, metal nitrides, non-metal oxides, non-metal nitrides and composites thereof Typically and preferably, the blanket hard mask layer 14 is formed from a hard mask material selected from the group of hard mask materials including but not limited to silicon oxide hard mask materials, silicon nitride hard mask materials and silicon nitride hard mask materials. Preferably, the blanket hard mask layer 14 so formed is formed to a thickness of from about 1000 to about 5000 angstroms upon the blanket oxygen containing plasma etchable layer 12.

Finally, within the first preferred embodiment of the present invention with respect to the patterned photoresist layers 16a and 16b, the patterned photoresist layers 16a and 16b may be formed from any of several photoresist materials as are conventional in the art of microelectronics fabrication, such photoresist materials being selected from the general groups of photoresist materials including but not limited to positive photoresist materials and negative photoresist materials. Preferably, the patterned photoresist layers 16a and 16b so formed are each formed to a thickness of from about 6000 to about 12000 angstroms.

Referring now to FIG. 2, there is shown a schematic cross-sectional diagram illustrating the results of further processing of the microelectronics fabrication whose schematic cross-sectional diagram is illustrated in FIG. 1. Shown in FIG. 2 is a schematic cross-sectional diagram of a microelectronics fabrication otherwise equivalent to the microelectronics fabrication whose schematic cross-sectional diagram is illustrated in FIG. 1, but wherein the blanket hard mask layer 14 has been patterned to form the patterned hard mask layers 14a and 14b through etching with a first etching plasma 18 while employing the patterned photoresist layers 16a and 16b as a first etch mask layer. Within the first preferred embodiment of the present invention, the first etching plasma 18 is an anisotropic etching plasma which employs an etchant gas composition appropriate to the material from which is formed the blanket hard mask layer 14. Within the first preferred embodiment of the present invention, where the blanket hard mask layer 14 is formed from a silicon containing dielectric material, such as but not limited to a silicon oxide dielectric material, a silicon nitride dielectric material or a silicon oxynitride dielectric material, the first etching plasma 18 preferably employs a fluorine containing (such as but not limited to a fluorocarbon containing) etchant gas composition.

Referring now to FIG. 3, there is shown a schematic cross-sectional diagram illustrating the results of further processing of the microelectronics fabrication whose schematic cross-sectional diagram is illustrated in FIG. 2. Shown in FIG. 3 is a schematic cross-sectional diagram of a microelectronics fabrication otherwise equivalent to the microelectronics fabrication whose schematic cross-sectional diagram is illustrated in FIG. 2, but wherein there is formed from the blanket oxygen containing plasma etchable layer 12 the patterned oxygen containing plasma etched layers 12a and 12b, through etching within a second etching plasma 20. As illustrated within the schematic cross-sectional diagram of FIG. 3, when etching with the second etching plasma 20 the oxygen containing plasma etchable layer 12 to form the oxygen containing plasma etched layers 12a and 12b, there is simultaneously partially etched the patterned photoresist layers 16a and 16b to form the partially etched patterned photoresist layers 16a' and 16b'. Nonetheless, it is also plausible and under certain circumstances preferred within the first preferred embodiment of the present invention that the patterned photoresist layers 16a and 16b as illustrated within the schematic cross-sectional diagram of FIG. 2 are completely stripped from the microelectronics fabrication whose schematic cross-sectional diagram is illustrated in FIG. 3 while simultaneously forming from the blanket oxygen containing plasma etchable layer 12 the patterned oxygen containing plasma etched layers 12a and 12b while employing the second etching plasma 20 as illustrated in FIG. 3. Such a simultaneous complete stripping of the pair of patterned photoresist layers 16a and 16b while simultaneously forming the pair of patterned oxygen containing plasma etched layers 12a and 12b is disclosed within the related co-pending and co-assigned patent application [attorney docket number TSMC 97-306] the contents of which are incorporated herein fully by reference.

Within the first preferred embodiment of the present invention, the second etching plasma 20 is an oxygen containing etching plasma employing an etchant gas composition comprising an oxygen containing etchant gas and a fluorine containing etchant gas.

Within the first preferred embodiment of the present invention, the etchant gas composition employed within the second etching plasma 20 may employ an oxygen containing etchant gas selected from the group of oxygen containing etchant gases including but not limited to oxygen, ozone, nitrous oxide and nitric oxide. In addition, within the first preferred embodiment of the present invention, the etchant gas composition employed within the second etching plasma 20 may employ a fluorine containing etchant gas selected from the group consisting of perfluorocarbons, hydrofluorocarbons, sulfur hexafluoride and nitrogen trifluoride.

Within the first preferred embodiment of the present invention the second etching plasma 20 is typically and preferably undertaken at a reactor chamber pressure substantially lower that a reactor chamber pressure typically employed when stripping patterned photoresist layers from microelectronics fabrications. While conventional dry oxygen plasma patterned photoresist layer stripping methods typically employ reactor chamber pressures of from about 0.5 to about 1.0 torr, within the first preferred embodiment of the present invention, the oxygen containing plasma etch method within which is employed the second etching plasma 20 preferably employs a reactor chamber pressure of from about 1 to about 100 mtorr, more preferably from about 1 to about 80 mtorr and most preferably from about 1 to about 30 mtorr. Under such circumstances, there is attenuated a lateral etching of the blanket oxygen containing plasma etchable layer 12 when forming the patterned oxygen containing plasma etched layers 12a and 12b.

In addition, within the first preferred embodiment of the present invention it is also desirable to employ within the oxygen containing plasma etch method which employs the second etching plasma 20 a sputtering gas component within the oxygen containing etchant gas composition. Similarly with the reduction of reactor chamber pressure, the presence of the sputtering gas component also attenuates lateral etching of the patterned oxygen containing plasma etched layers 12a and 12b when forming the patterned oxygen containing plasma etched layers 12a and 12b. Typical sputtering gas components include, but are not limited to argon and xenon, with argon being particularly preferred. Typically and preferably, the sputtering gas component is present at a volume percentage of from about 10 to about 70 percent of the etchant gas composition employed within the second etching plasma 20.

Upon forming the microelectronics fabrication whose schematic cross-sectional diagram is illustrated in FIG. 3, there is formed a microelectronics fabrication having formed therein a pair of patterned oxygen containing plasma etched layers formed of a carbon and fluorine containing material, where there is attenuated formation of a residue layer upon a sidewall of the patterned oxygen containing plasma etched layers.

Second Preferred Embodiment

Figure 4:
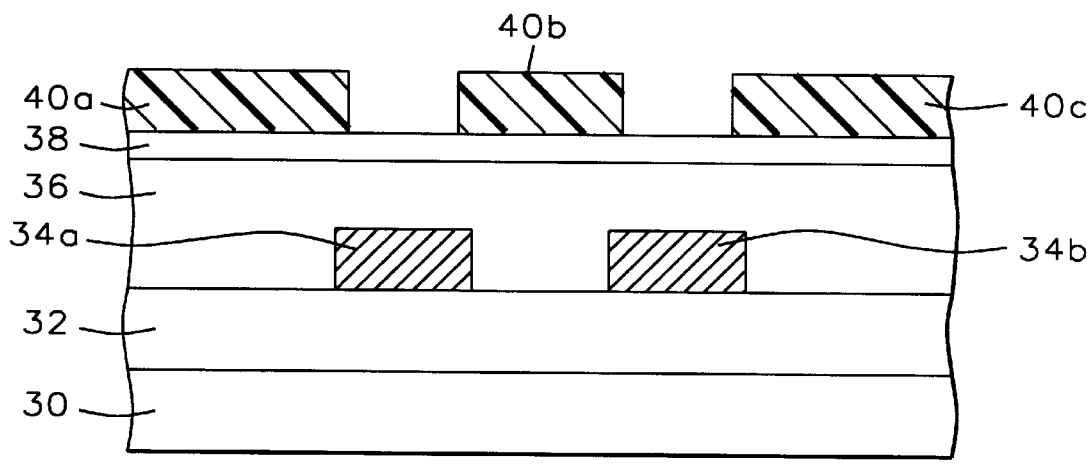
FIG. 4 to FIG. 6 show a series of schematic cross-sectional diagrams illustrating the results of forming within an microelectronics fabrication in accord with a more specific embodiment of the present invention which comprises a second preferred embodiment of the present invention a pair of vias through a low dielectric constant microelectronics dielectric layer formed of an oxygen containing plasma etchable dielectric material to access a pair of patterned conductor layers formed beneath the low dielectric constant microelectronics dielectric layer.
Figure 5:
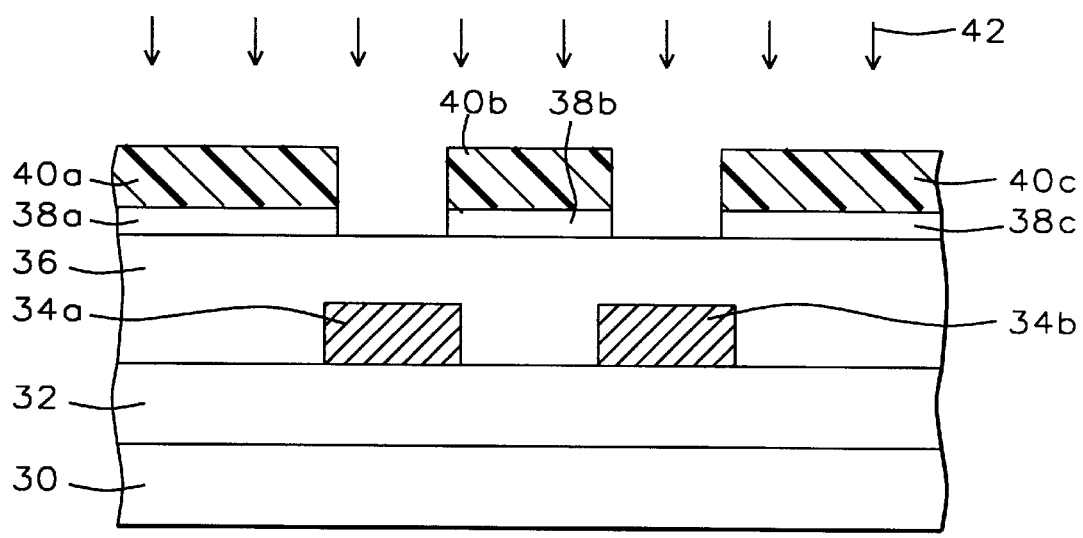
Figure 6:
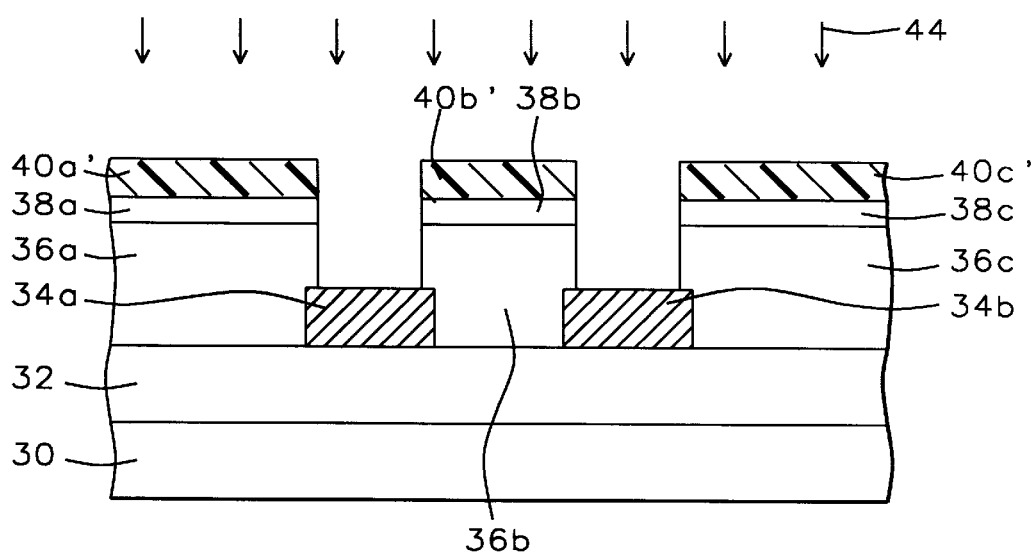

Referring now to FIG. 4 to FIG. 6, there is shown a series of schematic cross-sectional diagrams illustrating the results of forming within a microelectronics fabrication in accord with a more specific embodiment of the present invention which comprises a second preferred embodiment of the present invention a pair of vias through a low dielectric constant microelectronics dielectric layer formed of an oxygen containing plasma etchable dielectric material to access a pair of patterned conductor layers formed beneath the low dielectric constant microelectronics dielectric layer within the microelectronics fabrication. Shown in FIG. 4 is a schematic cross-sectional diagram of the microelectronics fabrication at an early stage in practice of the method of the present invention.

Shown in FIG. 4 is a substrate 30 employed within a microelectronics fabrication, where the substrate 30 has formed thereover a blanket first dielectric layer 32. In turn, the blanket first dielectric layer 32 has formed thereupon a pair of patterned conductor layers 34a and 34b. The patterned conductor layers 34a and 34b, and portions of the blanket first dielectric layer 36 exposed adjoining the patterned conductor layers 34a and 34b, have formed thereupon a blanket inter-metal dielectric (IMD) layer 36. In turn, the blanket inter-metal dielectric (IMD) layer 36 has formed thereupon a blanket hard mask layer 38. Finally, the blanket hard mask layer 38 has formed thereupon a series of patterned photoresist layers 40a, 40b and 40c.

Within the second preferred embodiment of the present invention, the substrate 30, analogously or equivalently with the substrate 10 employed within the first preferred embodiment of the present invention as illustrated within FIG. 1, may be a substrate employed within a microelectronics fabrication selected from the group of microelectronics fabrications including but not limited to integrated circuit microelectronics fabrications, solar cell microelectronics fabrications, ceramic substrate microelectronics fabrications and flat panel display microelectronics fabrications.

Within the second preferred embodiment of the present invention with respect to the blanket first dielectric layer 32, the blanket first dielectric layer 32 may be formed from any of several dielectric materials as are conventional in the art of microelectronics fabrication. Such dielectric materials may include, but are not limited to, silicon oxide dielectric materials, silicon nitride dielectric materials, silicon oxynitride dielectric materials, and composites thereof Preferably, the blanket first dielectric layer 32 as illustrated within the schematic cross-sectional diagram of FIG. 4 is formed from a silicon oxide dielectric material deposited employing a plasma enhanced chemical vapor deposition (PECVD) method, as is conventional in the art of microelectronics fabrication. Preferably, the blanket first dielectric layer 32 so formed is formed to a thickness of from about 1000 to about 5000 angstroms over the substrate 30.

Within the second preferred embodiment of the present invention with respect to the patterned conductor layers 34a and 34b, methods and materials through which patterned conductor layers may be formed within microelectronics fabrications are known in the art of microelectronics fabrication. Patterned conductor layers may be formed within microelectronics fabrications through patterning, through methods as are conventional in the art of microelectronics fabrication, of blanket conductor layers formed within microelectronics fabrications. Blanket conductor layers may be formed within microelectronics fabrications through methods including but not limited to thermally assisted evaporations methods, electron beam assisted evaporations methods, chemical vapor deposition (CVD) methods and physical vapor deposition (PVD) sputtering methods through which may be formed blanket conductor layers of conductor materials including but not limited to metals, metal alloys, doped polysilicon and polycides (doped polysilicon/metal silicide stacks). For the second preferred embodiment of the present invention, the patterned conductor layers 34a and 34b are preferably formed at least in part of an aluminum containing conductor material, beneath and/or above which is formed an optional barrier material, as is common in the art of microelectronics fabrication. Preferably the patterned conductor layers 34a and 34b so formed are each formed to a thickness of from about 3000 to about 5000 angstroms upon the blanket first dielectric layer 32.

Although not specifically illustrated within the schematic cross-sectional diagram of FIG. 4, the patterned conductor layers 34a and 34b are each formed of a linewidth preferably from about 0.3 to about 0.6 microns and each separated by a pitch distance preferably from about 0.6 to about 1.2 microns.

Within the second preferred embodiment of the present invention with respect to the blanket inter-metal dielectric (IMD) layer 36, while the blanket inter-metal dielectric (ID) layer 36 corresponds generally with the blanket oxygen containing plasma etchable layer 12 within the first preferred embodiment of the present invention insofar as the blanket inter-metal dielectric (IDD) layer 36 is also formed of an oxygen containing plasma etchable material formed of a carbon and fluorine containing material, within the second preferred embodiment of the present invention, the blanket inter-metal dielectric (IMD) layer 36 is formed from an oxygen containing plasma etchable material formed of a carbon and fluorine containing material which is also a low dielectric constant dielectric material. Such oxygen containing plasma etchable materials formed of carbon and fluorine containing materials may include, but are not limited to, fluorinated organic polymer spin-on-polymer materials (such as but not limited to fluorinated polyimide organic polymer spin-on-polymer materials and fluorinated poly (arylene ether) organic polymer spin-on-polymer materials) and fluorinated amorphous carbon materials. Within the second preferred embodiment of the present invention, the blanket inter-metal dielectric (IMD) layer 36 is preferably formed to a thickness of from about 1000 to about 5000 angstroms through spin-coating and thermal curing of a fluorinated poly (arylene ether) material at a temperature of from about 350 to about 450 degrees centigrade. Such fluorinated poly (arylene ether) dielectric materials are known in the art and are commercially available, for example, from Allied-Signal Corporation as Product Number 2.0 FLARE™ fluorinated poly (arylene ether) dielectric materials.

Within the second preferred embodiment of the present invention with respect to the blanket hard mask layer 38, although the blanket hard mask layer 38 may generally be formed employing methods and materials analogous or equivalent to the methods and materials employed in forming the optional blanket hard mask layer 14 employed within the first preferred embodiment of the present invention as illustrated in FIG. 1, within the second preferred embodiment of the present invention, the similarly optional blanket hard mask layer 38, if present, is preferably formed of a silicon oxide dielectric material deposited employing a plasma enhanced chemical vapor deposition PECVD) method employing silane as a silicon source material. Preferably, the blanket hard mask layer 38 so formed is formed to a thickness of from about 1000 to about 5000 angstroms upon the blanket inter-metal dielectric (IMD) layer 36.

Finally, within the second preferred embodiment of the present invention with .respect to the series of patterned photoresist layers 40a, 40b and 40c, the series of patterned photoresist layers 40a, 40b and 40c is preferably formed employing methods, materials, and dimensions analogous or equivalent to the methods, materials and dimensions employed in forming the patterned photoresist layers 16a and 16b within the first preferred embodiment of the present invention as illustrated within the schematic cross-sectional diagram of FIG. 1.

Referring now to FIG. 5, there is shown a schematic cross-sectional diagram illustrating the results of further processing of the microelectronics fabrication whose schematic cross-sectional diagram is illustrated in FIG. 4. Shown in FIG. 5 is a schematic cross-sectional diagram of a microelectronics fabrication otherwise equivalent to the microelectronics fabrication whose schematic cross-sectional diagram is illustrated in FIG. 4, but wherein the blanket hard mask layer 38 has been patterned to form the patterned hard mask layers 38a, 38b and 38c through etching with a first etching plasma 42 while employing the patterned photoresist layers 40a, 40b and 40c as a series of photoresist etch mask layers.

Within the second preferred embodiment of the present invention, where the blanket hard mask layer 38 is preferably formed of a silicon oxide hard mask material, the first etching plasma 42 is employed within a first plasma etch method which preferably employs a fluorine containing etchant gas composition, such as but not limited to a fluorocarbon containing etchant gas composition. More preferably, the first plasma etch method employs a carbon tetrafluoride, hexafluoroethane and argon etchant gas composition. Preferably, the first plasma etch method also employs: (1) a reactor chamber pressure of from about 3 to about 30 mtorr; (2) a radio frequency source power of from about 500 to about 2000 watts at a radio frequency of 13.56 MHZ; (3) a radio frequency bias power of from about 500 to about 2000 watts; (4) a substrate 30 temperature of from about 0 to about 20 degrees centigrade; (5) a carbon tetrafluoride flow rate of from about 5 to about 20 standard cubic centimeters per minute (sccm); (6) a hexafluoroethane flow rate of from about 10 to about 40 standard cubic centimeters per minute (sccm); and (7) an argon flow rate of from about 100 to about 200 standard cubic centimeters per minute (sccm), for a time period sufficient to completely etch through the blanket hard mask layer 38 when forming the patterned hard mask layers 38a, 38b and 38c.

Referring now to FIG. 6, there is shown a schematic cross-sectional diagram illustrating the results of further processing of the microelectronics fabrication whose schematic cross-sectional diagram is illustrated in FIG. 5. Shown in FIG. 6 is a schematic cross-sectional diagram of a microelectronics fabrication otherwise equivalent to the microelectronics fabrication whose schematic cross-sectional diagram is illustrated in FIG. 5, but wherein there has been simultaneously: (1) partially etched the patterned photoresist layers 40a, 40b and 40c to form the partially etched patterned photoresist layers 40a', 40b' and 40c'; and (2) patterned the blanket inter-metal dielectric (IMD) layer 36 to form the patterned inter-metal dielectric (IMD) layers 36a, 36b and 36c, through etching with a second etching plasma 44. Within the second preferred embodiment of the present invention, the second etching plasma 44 preferably employs methods and materials analogous or equivalent to the methods and materials employed in forming the second etching plasma 20 within the first preferred embodiment of the present invention as illustrated within the schematic cross-sectional diagram of FIG. 3.

More preferably, the second etching plasma 44 is employed within a oxygen containing plasma etch method which employs an etchant gas composition comprising an oxygen containing etchant gas and a fluorine containing etchant gas, preferably a hexafluoroethane fluorine containing etchant gas, preferably also with an optional argon sputtering gas component. Preferably, the oxygen containing plasma etch method also employs: (1) a reactor chamber pressure of from about 1 to about 100 mtorr; (2) a source radio frequency power of from about 500 to about 2000 watts at a source radio frequency of 13.56 MHZ; (3) a bias radio frequency power of from about 500 to about 2000 watts; (4) a substrate 30 temperature of from about 0 to about 20 degrees centigrade; (5) an oxygen flow rate of from about 10 to about 50 standard cubic centimeters per minute (sccm); (6) a hexafluoroethane flow rate of from about 1 to about 10 standard cubic centimeters per minute (sccm); and (6) an argon flow rate of from about 10 to about 50 standard cubic centimeters per minute (sccm), for a time period sufficient to reach the patterned conductor layers 34a and 34b, while simultaneously forming the patterned inter-metal dielectric (IMD) layers 36a, 36b and 36c.

When employing within the second preferred embodiment of the present invention the preferred materials as disclosed above for the patterned photoresist layers 40a, 40b and 40c, the blanket hard mask layer 38 and the blanket inter-metal dielectric (IMD) layer 36, along with the methods and materials as disclosed within the first etching plasma 42 and the second etching plasma 44, there is formed the microelectronics fabrication as illustrated within FIG. 6. The microelectronics fabrication has formed therein a pair of interconnection vias through an inter-metal dielectric (IMD) layer accessing a pair of patterned conductor layers, where the pair of interconnection vias is formed with attenuated residue layer formation upon the sidewalls of the pair of interconnection vias.

As is understood by a person skilled in the art, the preferred embodiments of the present invention are illustrative of the present invention rather than limiting of the present invention. Revisions and modifications may be made to methods, materials, structures and dimensions through which are fabricated microelectronics fabrications in accord with the preferred embodiments of the present invention while still providing microelectronics fabrications fabricated in accord with the spirit and scope of the present invention, as defined by the appended claims.

What is claimed is:

1. A method for forming a patterned layer within a microelectronics fabrication comprising:

providing a substrate employed within a microelectronics fabrication;

forming over the substrate a first layer etchable by an oxygen containing plasma, the first layer being comprised of fluorinated poly (arylene ether);

forming over the first layer a mask layer;

etching through the first layer using an oxygen containing plasma etch method while employing the mask layer as an etch mask layer to form a patterned first layer, the oxygen containing plasma etch method employing an etchant gas composition comprising an oxygen containing etchant gas and a fluorine containing etchant gas.

2. The method of claim 1 wherein the fluorine containing etchant gas attenuates formation of a residue layer upon a sidewall of the patterned first layer.

3. The method of claim 1 wherein the microelectronics fabrication is selected from the group consisting of integrated circuit microelectronics fabrications, solar cell microelectronics fabrications, ceramic substrate microelectronics fabrications and flat panel display microelectronics fabrications.

4. The method of claim 1 wherein the mask layer is selected from the group consisting of photoresist mask layers and hard mask layers.

5. The method of claim 1 wherein the oxygen containing etchant gas is selected from the group consisting of oxygen, ozone, nitrous oxide and nitric oxide.

6. The method of claim, 5 wherein the etchant gas composition also employs a sputtering gas component.

7. The method of claim 1 wherein the fluorine containing etchant gas is selected from the group consisting of perfluorocarbons, hydrofluorocarbons, sulfur hexafluoride and nitrogen trifluoride.

8. The method of claim 1, wherein the oxygen containing Plasma etch method is conducted at a pressure of from about 1 to 100 mTorr.

9. The method of claim 1, wherein the oxygen containing plasma etch method is conducted at a pressure of from about 1 to 80 mTorr.

10. The method of claim 1, wherein the oxygen containing plasma etch method is conducted at a pressure of from about 1 to 30 mTorr.

11. The method of claim 1, wherein the etchant gas composition comprises a mixture of $O_2$, Ar, and $C_2F_6$.

12. The method of claim 1, wherein the etchant gas composition also employs a sputtering gas component selected from the group comprising argon and xenon.

13. The method of claim 1, wherein the etchant gas composition also employs a sputtering gas component, the sputtering gas component being from about 10 to 70 volume percent of the etchant gas composition.

14. The method of claim 1, wherein the etchant gas composition also employs a sputtering gas component selected from the group comprising argon and xenon, the sputtering gas component being from about 10 to 70 volume percent of the etchant gas composition.

15. A method for forming a patterned layer within a microelectronics fabrication comprising:

providing a substrate employed within a microelectronics fabrication;

forming over the substrate a first layer etchable by an oxygen containing plasma, the first layer being comprised of fluorinated poly (arylene ether);

forming over the first layer a mask layer;

etching through the first layer using an oxygen containing plasma etch method while employing the mask layer as an etch mask layer to form a patterned first layer, the oxygen containing plasma etch method employing an etchant gas composition comprising an oxygen containing etchant gas and a fluorine containing etchant gas at a pressure from about 1 to 100 mTorr; the etchant gas composition further employing a sputtering gas component.

16. The method of claim 15 wherein the fluorine containing etchant gas attenuates formation of a residue layer upon a sidewall of the patterned that layer.

17. The method of claim 15 wherein the microelectronics fabrication is selected from the group consisting of integrated circuit microelectronics fabrications, solar cell microelectronics fabrications, ceramic substrate microelectronics fabrications and flat panel display microelectronics fabrications.

18. The method of claim 15 wherein the mask layer is selected from the group consisting of photoresist mask layers and hard mask layers.

19. The method of claim 15 wherein the oxygen containing etchant gas is selected from the group consisting of oxygen, ozone, nitrous oxide and nitric oxide.

20. The method of claim 15 wherein the fluorine containing etchant gas is selected from the group consisting of perfluorocarbons, hydrofluorocarbons, sulfur hexafluoride and nitrogen trifluoride.

21. The method of claim 15, wherein the oxygen containing plasma etch method is conducted at a pressure of from about 1 to 80 mTorr.

22. The method of claim 15, wherein the oxygen containing plasma etch method is conducted at a pressure of from about 1 to 30 mTorr.

23. The method of claim 15, wherein the etchant gas composition comprises a mixture of $O_2$, $A_r$, and $C_2F_6$.

24. The method of claim 15, wherein the etchant gas composition also employs a sputtering gas component selected from the group comprising argon and xenon.

25. The method of claim 15, wherein the etchant gas composition also employs a sputtering gas component, the sputtering gas component being from about 10 to 70 volume percent of the etchant gas composition.

26. The method of claim 15, wherein the etchant gas composition also employs a sputtering gas component selected from the group comprising argon and xenon, the sputtering gas component being from about 10 to 70 volume percent of the etchant gas composition.

* * * * *